(12) United States Patent
Blank et al.

(10) Patent No.: US 12,080,789 B2
(45) Date of Patent: Sep. 3, 2024

(54) SEMICONDUCTOR DIE AND METHOD OF MANUFACTURING THE SAME

(71) Applicant: Infineon Technologies Austria AG, Villach (AT)

(72) Inventors: Oliver Blank, Villach (AT); Heimo Hofer, Bodensdorf (AT); Andreas Kleinbichler, Villach (AT); Martin Poelzl, Ossiach (AT)

(73) Assignee: Infineon Technologies Austria AG, Villach (AT)

( * ) Notice: Subject to any disclaimer, the term of this patent is extended or adjusted under 35 U.S.C. 154(b) by 119 days.

(21) Appl. No.: 17/481,446

(22) Filed: Sep. 22, 2021

(65) Prior Publication Data
US 2022/0102547 A1  Mar. 31, 2022

(30) Foreign Application Priority Data

Sep. 25, 2020 (EP) .................... 20198474

(51) Int. Cl.
| | | |
|---|---|---|
| H01L 29/78 | (2006.01) | |
| H01L 21/28 | (2006.01) | |
| H01L 21/3065 | (2006.01) | |
| H01L 29/49 | (2006.01) | |
| H01L 29/66 | (2006.01) | |
| H01L 29/08 | (2006.01) | |
| H01L 29/417 | (2006.01) | |

(52) U.S. Cl.
CPC .... *H01L 29/7811* (2013.01); *H01L 21/28123* (2013.01); *H01L 21/3065* (2013.01); *H01L 29/4925* (2013.01); *H01L 29/66712* (2013.01); *H01L 29/7813* (2013.01); *H01L 29/0865* (2013.01); *H01L 29/41766* (2013.01)

(58) Field of Classification Search
CPC .......... H01L 29/7811; H01L 21/28123; H01L 21/3065; H01L 29/4925; H01L 29/66712; H01L 29/7813; H01L 29/0865; H01L 29/41766; H01L 29/404; H01L 29/407; H01L 23/528; H01L 29/66727; H01L 29/66734; H01L 27/0886; H01L 21/823431; H01L 21/823475; H01L 21/02164; H01L 21/0217; H01L 21/02274; H01L 23/53266; H01L 23/53295; H01L 29/4236
See application file for complete search history.

(56) References Cited

U.S. PATENT DOCUMENTS

| | | |
|---|---|---|
| 2010/0187642 A1 | 7/2010 | Grivna |
| 2013/0049100 A1 | 2/2013 | Su et al. |
| 2015/0333140 A1 | 11/2015 | Yoshida |
| 2018/0301553 A1* | 10/2018 | Weyers ............... H01L 27/0255 |
| 2019/0123209 A1* | 4/2019 | Zeng ................. H01L 29/66742 |
| 2020/0044078 A1* | 2/2020 | Yilmaz ............... H01L 29/4236 |
| 2021/0367069 A1* | 11/2021 | Rigaud-Minet ....... H01L 29/205 |

\* cited by examiner

Primary Examiner — Mohammed R Alam
(74) Attorney, Agent, or Firm — Murphy, Bilak & Homiller, PLLC

(57) ABSTRACT

A semiconductor die is described. The semiconductor die includes a semiconductor body having an active region, a metallization formed on the semiconductor body, and a passivation formed on the metallization. The metallization includes at least one of a titanium layer, a titanium nitride layer, and a tungsten layer. The passivation includes a silicon oxide layer. Corresponding methods of manufacturing and using the semiconductor die are also described.

6 Claims, 9 Drawing Sheets

SEMICONDUCTOR DIE AND METHOD OF MANUFACTURING THE SAME

TECHNICAL FIELD

The present disclosure relates to a semiconductor die with a semiconductor body in which an active region is formed.

BACKGROUND

In the active region of the semiconductor body, for instance a vertical field effect transistor can be formed, having a vertical channel in a body region laterally aside a gate region with a gate electrode. Via a gate voltage applied, the channel formation can be controlled, e.g. the vertical current flow between source and drain. This shall illustrate a possible device formed in the active region, without limiting the universality of the claims and the description.

SUMMARY

It is an object of the present application to provide an improved semiconductor die, as well as a method of manufacturing such a die.

On the semiconductor body, which comprises the active region, a metallization is formed, comprising a titanium (Ti) layer and/or a titanium nitride (TiN) layer and/or a tungsten (W) layer. On this metallization, a passivation is formed, which comprises a silicon oxide layer.

The Ti and/or TiN and/or W layer can for instance allow for fine structured conductor lines. For power devices, this can be of interest, for example, in terms of a wiring of individual transistor cells, see in detail below. On the other hand, e.g. sharp topographic edges and small distances of a fine structured conductor line can lead to high electric fields that can trigger or drive diffusion processes, in particular in view of the aforementioned metallization materials. In this respect, the silicon oxide can for instance allow for a thicker passivation, e.g. with a lower mechanical stress level compared to a silicon nitride passivation with the same thickness. This can reduce the susceptibility to crack formation, for instance at the sharp edges mentioned, and in consequence reduce the susceptibility to corrosion and diffusion of tungsten or titanium, thus.

Advantageous embodiments and features are provided throughout the disclosure. The disclosure relates to apparatus and device aspects, but also to method and use aspects. If for instance a die manufactured in a specific way is described, this is also a disclosure of a respective manufacturing process, and vice versa. In general words, an approach of this application is to form a passivation with a silicon oxide layer on a metallization formed on the semiconductor body, e.g. on an insulation layer formed on the semiconductor body.

In general, the metallization can consist of only one of the aforementioned layers (Ti/TiN/W). In particular, it can be a stack comprising at least two of the layers, for instance TiN/W or Ti/W, in particular a stack comprising all three of them. Below, "Ti/TiN/W metallization" refers to either one of the layers or to a stack with two or more of them. Independently of the number of layers, the metallization can for instance have a total thickness of not more than 500 nm, 400 nm, 300 nm or 200 nm. By limiting the thickness, a too large step can be avoided, reducing the susceptibility to cracking. A possible lower limit can for example be 50 nm.

A respective layer of the metallization can for instance consist of at least 50 percent by weight (wt %) of the respective material (Ti or TiN or W), so that the Ti layer consists of at least 50 wt % Ti and/or the TiN layer consists of at least 50 wt % TiN and/or the W layer consists of at least 50 wt % W. Further lower limits of the weight percentage of the respective material in the respective layer can be 60 wt %, 70 wt %, 80 wt % or 90 wt %, the respective layer can also consist in total of the respective material (100 wt %). An example for a layer consisting only partly of the respective material can be a W layer comprising for instance additionally Ti, the Ti having for instance a weight percentage of 10-30 wt %, e.g. around 20 wt %.

In the active region of the semiconductor body, a transistor device can be formed, comprising for instance a plurality of transistor cells connected in parallel. The metallization can in particular be formed on an insulation layer arranged on the semiconductor body, for example borophosphosilicate glass (BPSG). On the Ti/TiN/W metallization a frontside metal contact can be formed, in particular a copper or aluminum metallization, e.g. AlCu. The Ti/TiN/W metallization can extend at least partly outside the active area of the die, namely above an edge termination region instead of the active region. In contrast to the latter, e.g. no electrical current flows through the semiconductor body in the edge termination region.

The transistor device formed in the active region can in particular be a power device, e.g. have a breakdown voltage of at least 10 V, 20 V, 30 V, 40 V or 50 V, with possible upper limits of for instance not more than 800 V, 600 V, 400 V or 200 V (typical voltage classes can for instance be 60 V, 80 V, 100 V, 150 V and 200 V). The transistor device can in particular have a vertical design, the gate region arranged laterally aside the channel region, e.g. in a vertical gate trench. The latter can extend into the semiconductor body from the frontside thereof. A gate dielectric can be arranged at a sidewall of the trench, and a gate electrode made of an electrically conductive material can be arranged in the trench, the gate electrode made for instance of polysilicon or a metal, e.g. TiN and/or W, in particular as a TiN/W stack. The source region made of a first conductivity type can be formed at a frontside of the die and the drain region made of the same conductivity type at the backside. Vertically in between, the body region comprising the channel region and made of a second conductivity type can be formed. Optionally, a drift region can be arranged between the body and the drain region, made of the same conductivity type like the drain region (first type) but with a lower doping.

In an embodiment, a first and a second conductor line are formed in the metallization, wherein the first and second conductor line have a lateral distance of 2 in at maximum and/or a respective lateral width of 2 μm at maximum. As discussed above, the Ti/TiN/W metallization can allow for such a small width or narrow pitch. On the other hand, the passivation with the silicone oxide layer can compensate the larger electrical fields resulting from the smaller distance between the conductor lines. Moreover, the small structures can also have comparably sharp topographic edges, the susceptibility to cracking being increased as well.

Further upper limits of the lateral distance between the conductor lines and/or of the lateral conductor line width can for instance be 1.5 μm, 1 μm, 0.8 μm or 0.6 μm. Possible lower limits of the distance and/or width can for instance be 0.3 μm or 0.4 μm. The small conductor lines or narrow pitch can allow for a wiring of transistor cells arranged in the active region, in particular in case of a gate grid circumscribing cells with needle field electrodes, see in detail below. When the gate contacts and the source/needle field electrode contacts are arranged alternatingly, the lateral pitch between these conductor lines can for instance be half of the cell pitch, e.g. half of the pitch between the needle field electrodes.

In an embodiment, the first conductor line is on source potential, and the second conductor line is on gate potential. The voltage drop between gate and source can be more than 5 V, 7 V or 8 V, e.g. around 10 V in normal operation. Depending also on the distance between the conductor lines, an electrical field can be approximately 10 V/μm or even more, what is possible due to the silicon oxide passivation. Possible upper limits of the voltage drop can be 30 V, 25 V or 20 V.

In an embodiment, a plurality first and second conductor lines are formed in the metallization. The first conductor lines can be interconnected, e.g. be on the same electrical potential, in particular source potential. The second conductor lines can be interconnected as well, namely be on the same electrical potential, for instance gate potential. The first and second conductor lines can be arranged alternatingly in a first lateral direction, e.g. a respective first conductor line being laterally enclosed between two second conductor lines, and vice versa. In other words, the conductor lines can form an interlaced comb structure allowing for instance a wiring of a gate grid array with needle field electrodes. In a second lateral direction, perpendicular to the first lateral direction, the conductor lines can in particular have a straight extension.

In a particular application, the first conductor lines can for instance contact field electrode regions, in particular field electrode regions formed in an edge termination region (outside the active region). These field electrode regions can in particular be needle field electrode regions formed in spicular or columnar trenches. The field electrode regions formed in the edge termination region and connected to source potential can for instance allow for a blocking of the drain voltage in the edge of the device. Likewise, for example, the gate dielectric, e.g. gate oxide, in the gate trench can be protected from the comparably high drain potential.

In an embodiment, the silicon oxide layer of the passivation has a thickness of 50 nm at minimum, further lower limits being for instance 80 nm, 100 nm, 120 nm, 140 nm, 160 nm, 180 nm and 200 nm. Possible upper limits are for instance 1000 nm, 750 nm, 500 nm, 400 nm or 350 nm. Generally, this oxide layer thickness is taken above the metallization, and laterally aside it can be larger, e.g. in between the conductor lines.

In an embodiment, the silicon oxide layer of the passivation is a high-density plasma deposited silicon oxide (HDP oxide). During the deposition, it is partly sputtered away at the same time. This reduces or compensates the topography, reducing for instance a seam line and void formation between the conductor lines. Due to the sputtering, the thickness of the HDP oxide can be smaller above a respective conductor line.

In an embodiment, the passivation additionally comprises a silicon nitride (SiN) layer. In a respective passivation stack, the silicon nitride can for instance act as an adhesion promoter, whereas the silicon oxide serves mainly for corrosion protection. Generally, independently of whether a SiN layer is provided or not, an imide layer can be formed above the passivation. The imide can be arranged on top of the silicon oxide layer, in particular with a silicon nitride layer in between. Though the imide can provide an additional protection, it could become critical in case of passivation cracks, because it can soak humidity and promote a corrosion, thus. With the silicon oxide layer, this risk can be reduced.

In an embodiment, a first SiN layer is formed between the metallization and the oxide layer, and a second SiN layer is formed on the silicon oxide layer. The first SiN layer can improve the adhesion of the oxide layer on the metallization. The second SiN layer can protect the oxide layer and/or promote the adhesion of imide on the oxide.

In an embodiment, a SiN layer of the passivation has a thickness of 200 nm at maximum. Further upper limits can for instance be 150 nm, 120 nm, 100 nm, 90 nm or 80 nm at maximum, possible lower limits can for example be at least 20 nm or 30 nm. The silicon nitride can cause more mechanical stress compared to the silicon oxide, and the limitation of the thickness can reduce the mechanical stress in the stack. In case of a passivation with more than one SiN layer, in particular each SiN layer can have a respectively limited thickness.

In an embodiment, a sodium stopper groove is formed in the insulation layer arranged on the semiconductor body. The sodium stopper groove is filled with a metal filler which can in particular comprise a titanium and/or titanium nitride and/or tungsten layer. A respective metal filler can allow for a comparably compact design, the sodium stopper groove can for instance have a lateral width of not more than 2 μm, 1.5 μm or 1 μm (possible lower limits are 80 nm, 100 nm or 120 nm). The sodium stopper groove intersects the insulation layer vertically. This vertical intersection can cut a path for the sodium diffusion which can occur in undoped layers. It can for instance prevent a sodium diffusion from the edge of the die via the insulation layer into the active region. In particular, the sodium stopper groove can surround the active region over a whole circumference, forming a closed line.

In general, the passivation with the oxide layer can be formed directly on the metal filler of the sodium stopper. However, in particular, a conductor line can be formed in the Ti/TiN/W metallization on top of the metal filler, and this conductor line can be covered with the passivation, in particular with the oxide layer.

In an embodiment, a frontside metal contact is formed above the active region, in particular a gate and/or a source contact. The frontside metal contact layer can for instance have a thickness of at least 2 μm, 4 μm or 5 μm (possible upper limits can be 20 μm, 50 μm or 10 μm). It can be made of copper or in particular aluminum, e.g. AlCu. The frontside metal contact can in particular be the uppermost metal layer of the die. In the Ti/TiN/W metallization, a conductor line or pad structure can be formed, which extends at least partly below the frontside metal contact. In particular, no further metal layer can be arranged vertically in between the frontside metal contact and the Ti/TiN/W metallization.

In at least an edge area of the frontside metal layer, the passivation with the oxide layer, and possibly the silicon nitride layer or layers, can be arranged vertically in between the conductor line or pad structure formed in the metallization and the frontside metal contact. In another area, e.g. centrally above the active region, the frontside metal contact and the conductor line or pad structure formed in the metallization can be in an electrical contact, forming for instance the source connection. In other words, the frontside metal contact and the conductor line or pad structure in the metallization are not necessarily isolated completely. However, arranging the passivation with the oxide layer vertically in between at the edge of the frontside metal contact can for instance prevent an interface between imide, silicon nitride and one of metallization materials, in particular an imide/tungsten/silicon nitride interface.

Taken from the edge of the frontside metal contact, the passivation with the oxide layer can for instance extend laterally over at least 2 µm, 4 µm or 5 µm between the frontside metal contact and the metallization, possible upper limits can be 50 µm, 40 µm, 30 µm, 20 µm or 10 µm. Generally, a frontside passivation can be formed on the frontside metal contact. In particular, the frontside passivation can comprise a silicon oxide layer, for instance a HDP oxide layer. This embodiment, namely a frontside passivation with a silicon oxide layer formed on a frontside metal contact, shall also be disclosed independently of a passivation formed on a Ti/TiN/W metallization. Nevertheless, other features disclosed in this application can be incorporated into this frontside passivation embodiment, the passivation can for instance additionally comprise one or more silicon nitride layers.

The disclosure relates also to a method of manufacturing a semiconductor die, wherein the metallization is formed on the semiconductor body by depositing a Ti and/or a TiN and/or a W layer;

the passivation is formed on the metallization by depositing the silicon oxide layer.

In general, a plasma enhanced chemical vapor deposition (PECVD) can be applied for the silicon oxide layer deposition. In particular, it can be deposited as a high-density plasma.

In an embodiment, a first silicon nitride layer is formed below the oxide layer on the Ti/TiN/W metallization, for example in a PECVD process. After the silicon oxide layer having been deposited onto the first silicon nitride layer, a lithography step can be applied to structure the passivation. In particular, the oxide layer can be structured, e.g. with an anisotropic plasma etch, and be used as a hard mask for structuring the first silicon nitride layer below. The silicon nitride layer can be etched by an anisotropic or in particular isotropic plasma etch process, for instance after a removal of the photoresist from the silicon oxide layer used as a hard mask. After the removal of the photoresist and before etching the first silicon nitride layer and/or after etching the first silicon nitride layer by using the oxide layer as a hard mask, a respective wet chemical clean can be applied, for instance to remove polymer residues or chemicals from the plasma etch.

After structuring the passivation, the frontside metal contact can be deposited, in particular AlCu. In case of a passivation stack with a second silicon nitride layer on top of the silicon oxide layer, the second silicon nitride layer can be structured together with the silicon oxide (by lithography and plasma etch), or an additional etch step can be applied previously.

The invention relates also to a method of using a semiconductor die disclosed here, wherein an electrical potential difference of 5 V at minimum is applied between a first and a second conductor line formed in the metallization. Regarding further lower and upper limits, reference is made to the description above.

BRIEF DESCRIPTION OF THE DRAWINGS

Below, the semiconductor die and the manufacturing of the same are explained in further detail by means of exemplary embodiments. The individual features can also be relevant for the disclosure in a different combination.

DETAILED DESCRIPTION

Figure 1:
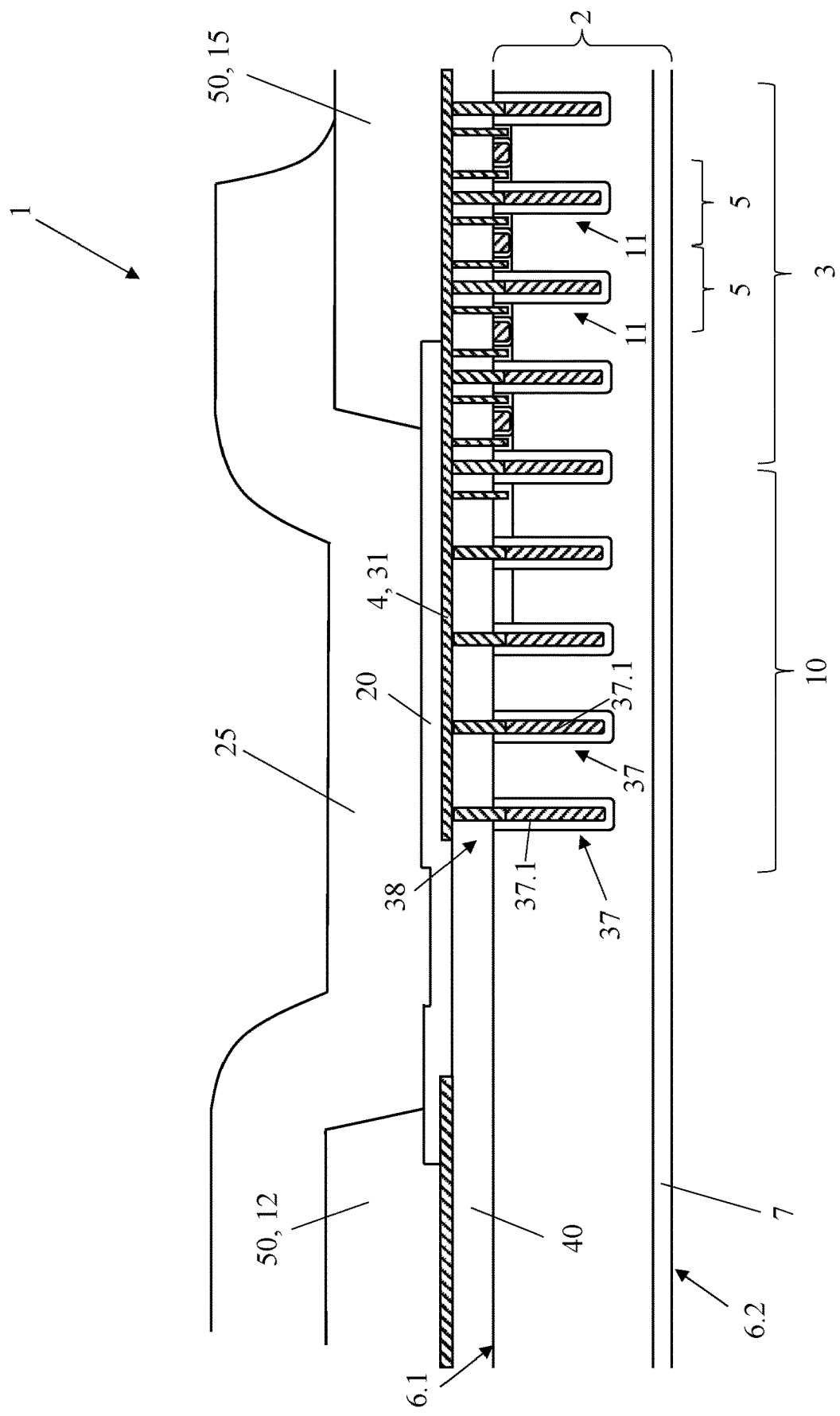
FIG. 1 shows a portion of a semiconductor die in a vertical cross section illustrating an area between a gate runner and an active region of the die.

FIG. 1 shows a portion of a semiconductor die in a vertical cross section. The die 1 comprises a semiconductor body 2 with an active region 3. In the active region 3, a plurality transistor cells 5 are formed, see FIG. 5 in detail. On a frontside 6.1 of the semiconductor body 2, an insulation layer 40 is formed. A drain region 7 is formed vertically opposite at the backside 6.2. In the active area 3, a frontside metal contact 50 serving as a source contact 15 is arranged. In operation, the current flows vertically between the frontside metal contact 50 and the drain region 7 through the transistor cells 5, namely through those cells that have a source implant (in practice, one or more cells at the border of the active region 3 can be formed without source implant).

Aside the active region 3, an edge termination region 10 is formed. Laterally between a die edge (further on the left, not visible here) and the edge termination region 10, a gate runner 12 formed in the frontside metal contact 50 is arranged. It extends laterally along the active region 3. As illustrated in detail below, the transistor cells 5 form a grid pattern in the active region 3. In the center of each cell 5 of the grid, a needle field electrode region 11 is arranged.

Figure 6:
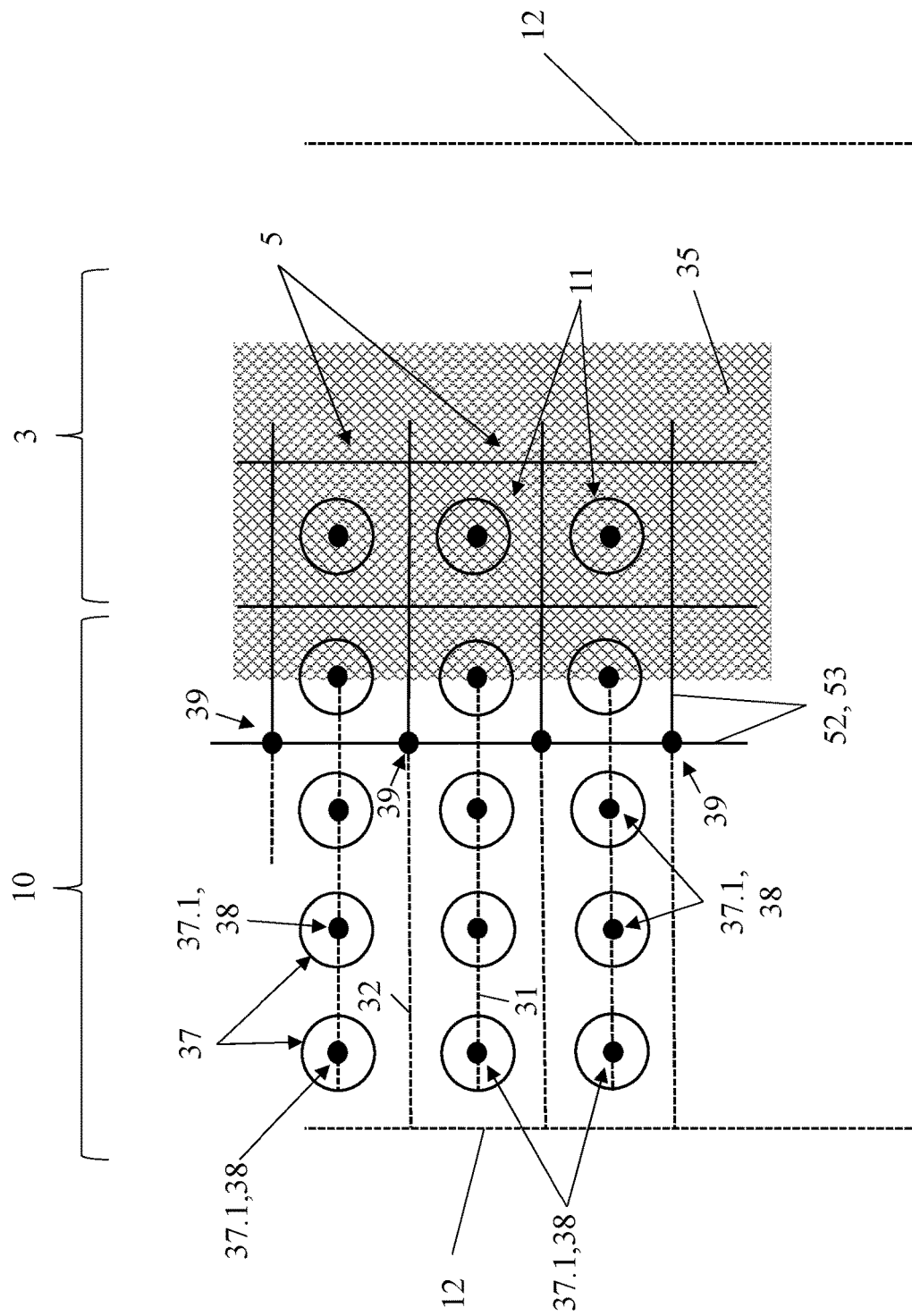
FIG. 6 illustrates the arrangement of the transistor cells in the active region in a schematic top view.

Laterally along the active region 3, namely into the drawing plane in FIG. 1, the source connections 38 of field electrode regions 37 in the edge termination region 10 and gate connections 39 (not visible in FIG. 1) are arranged consecutive, alternating with half the cell pitch in this example, see FIG. 6 in detail. In consequence, the wiring requires alternating conductor lines arranged with a small pitch (see FIG. 3 for illustration). To allow for such a wiring, a metallization 4 is formed on the semiconductor body 2, in particular on the insulation layer 40. It comprises a titanium and/or titanium nitride and/or tungsten layer, allowing for a fine structuring and pitch. For the wiring, first and second conductor lines 31,32 are formed in the metallization 4, see FIG. 2 (the sectional plane of FIG. 1 lies in a first conductor line 31 forming the source connection 38, the gate connections 39 are formed in front of and behind the drawing plane).

Figure 2:
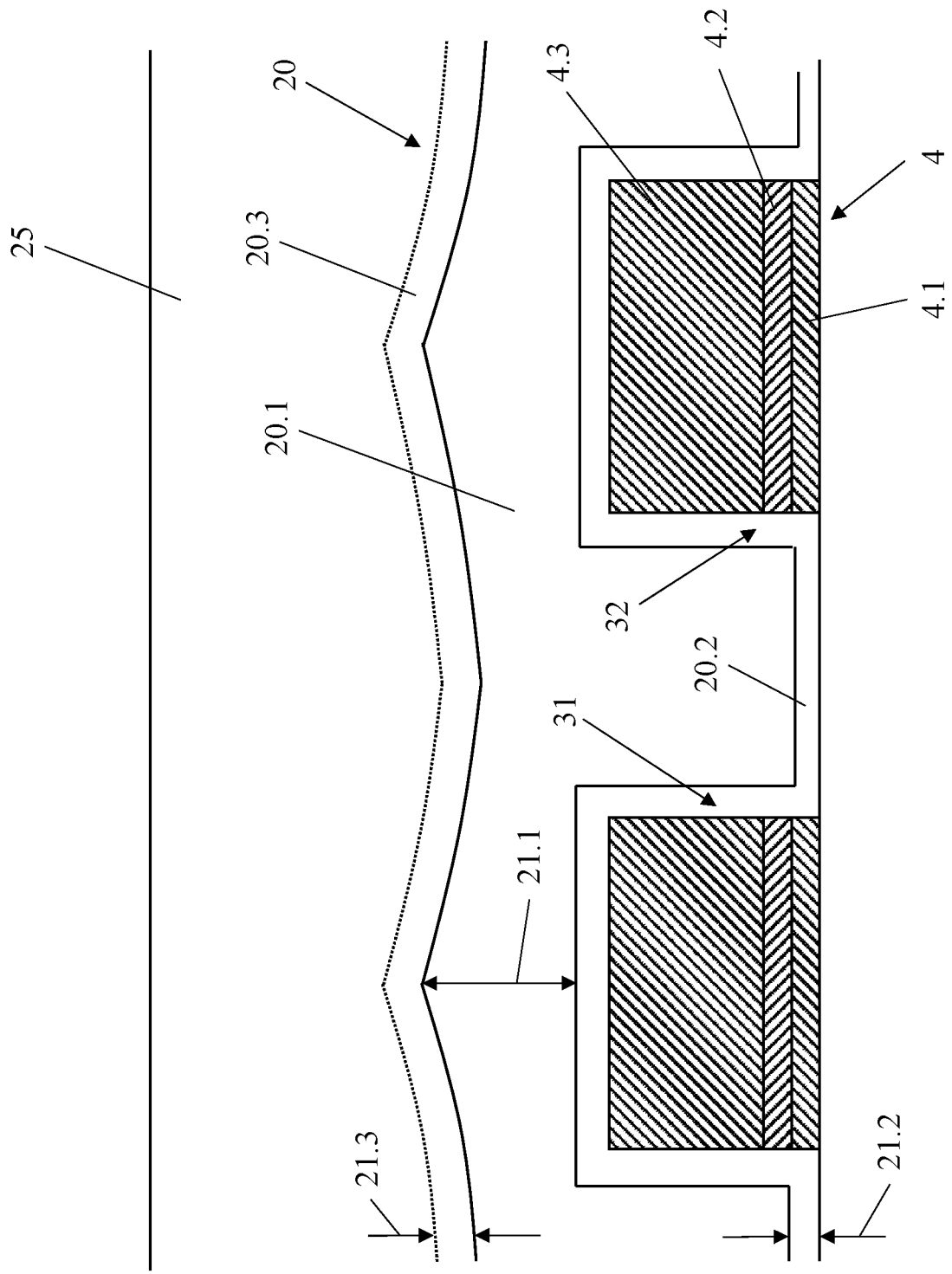
FIG. 2 illustrates an enlarged view of conductor lines in a vertical cross section perpendicular to the sectional plane of FIG. 1, which are formed in a Ti/TiN/W metallization and serve for source and gate wiring.

FIG. 2 illustrates a first and a second conductor line 31, 32 in a sectional plane perpendicular to the drawing plane of FIG. 1. In this example, the metallization 4 is formed of a titanium layer 4.1, a titanium nitride layer 4.2 and a tungsten layer 4.3. In alternative embodiments, one or two of the layers can be omitted. Since the first conductor line 31 is on source potential and the second conductor line 32 is on gate potential, the voltage drop between the conductor lines 31, 32 can for instance be around 10 V. Due to the small dimensions, the electrical field can be around 10 V per μm or even more. To withstand this electrical field and prevent a corrosion or diffusion, a passivation 20 is formed on the metallization 4.

The passivation 20 comprises a silicon oxide layer 20.1 formed by high-density plasma deposition in this example. Compared to silicon nitride, the mechanical stress can be smaller in silicon oxide, allowing for a thicker passivation. In the example here, the thickness 21.1 of the silicon oxide layer 20.1 is around 150 nm. Below the silicon oxide layer 20.1, the passivation 20 comprises a first silicon nitride layer 20.2. The latter can provide for a good adhesion between the metallization 4 and the silicon oxide layer 20.1. On top of the silicon oxide layer 20.1, a second silicon nitride layer 20.3 can be formed, improving for instance the adhesion of an imide layer 25 covering the passivation 20. The silicon nitride layers 20.2, 20.3 are thinner than the silicon oxide layer 20.1, having a respective thickness 21.2, 21.3 of around 50 nm in the example here.

Figure 3:
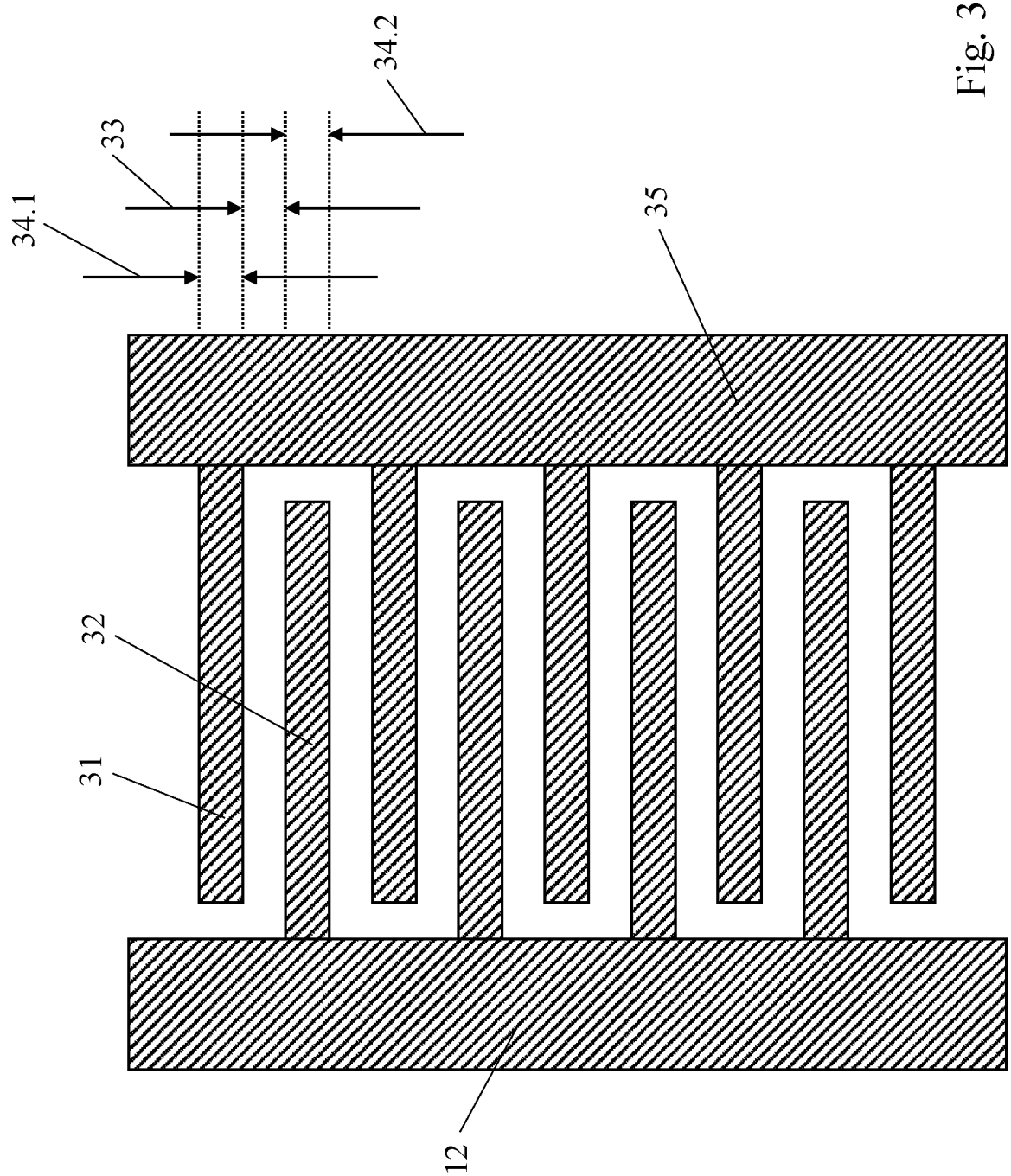
FIG. 3 illustrates the conductor lines of FIG. 2 in a top view.

FIG. 3 illustrates the arrangement of the first and second conductor lines 31, 32 in a top view. Due to the materials chosen for the metallization 4, the conductor lines 31, 32 have a lateral width 34.1, 34.2 of only around 500 nm in this example. The lateral distance 33 between the first and the second conductor lines 31, 32 is also only around 500 nm. The first conductor lines 31, which are on source potential, can contact the field electrodes 37.1 of the needle-shaped field electrode regions 37 formed in the edge termination region 10 (see FIG. 1) on source potential. The second conductor lines 32, which engage in a comb-like structure, can connect the gate connections 39 laterally in between towards the gate runner 12 on the left.

Figure 4:
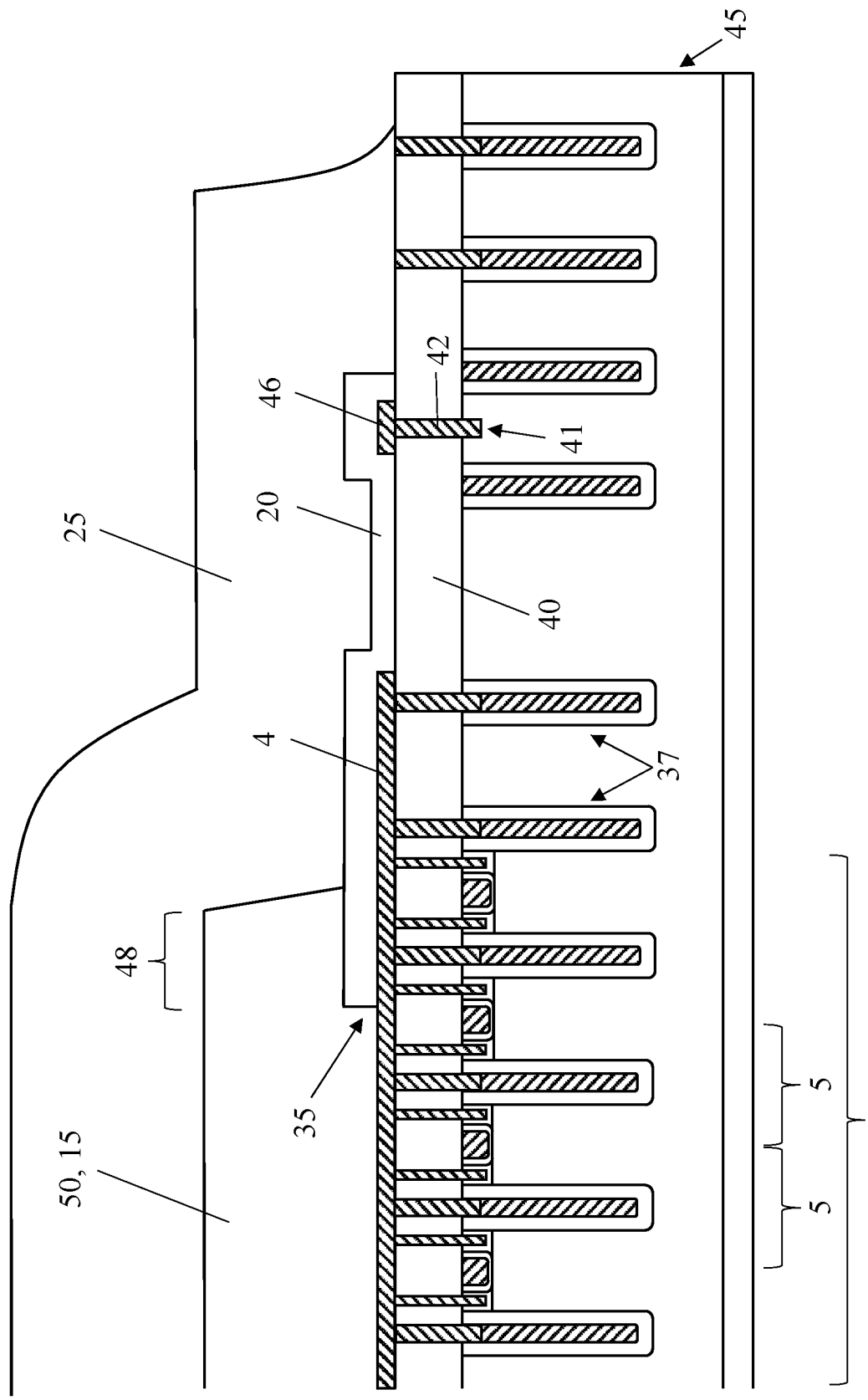
FIG. 4 illustrates the semiconductor die of FIG. 1 in another vertical cross sectional plane.

FIG. 4 shows a further cross section through the die 1, illustrating an edge 45 of the die 1. The gate runner 12 shown in FIG. 1 does not extend over the whole circumference around the active region 3, why it is not visible in the sectional plane of FIG. 4. In FIG. 4, a sodium stopper groove 41 intersecting the insulation layer 40 is visible. The sodium stopper groove 41 is filled with a metal filler 42, e.g. tungsten. The metal filler 42 is covered by the passivation 20 comprising the silicon oxide layer 20.1. In detail, a conductor line 46 can be formed in the metallization 4 above the metal filler 42, the passivation 20 covering the conductor line 46.

In the metallization 4, in addition to the conductor lines 31, 32, a pad structure 35 can be formed, e.g. below the source contact 15. In an edge region 48 of the frontside metal contact 50, the passivation 20 is arranged vertically between the conductor line or pad structure 35 and the frontside metal contact 50. The edge region 48 can extend laterally over a few micrometers, e.g. over 6 μm in case of the source contact 15 and over 2 μm in case of the gate runner 12, see FIG. 1. In the figure, only two field electrode regions 37 are shown in the edge region, even though more field electrode regions can be provided in practice, e.g. four field electrode regions (as shown in FIG. 1).

Figure 5:
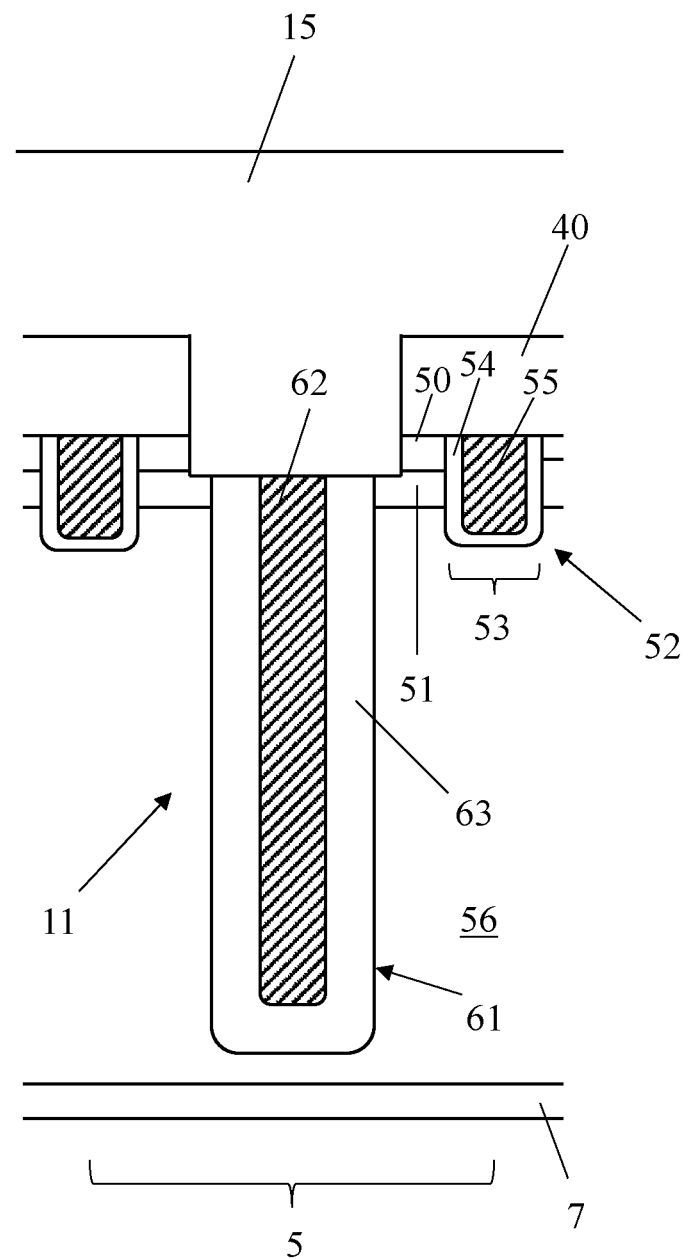
FIG. 5 shows a transistor cell formed in the active region of the die of FIGS. 1 and 4.

FIG. 5 illustrates a transistor cell 5 as referenced in FIGS. 1 and 4 in a detailed view. It comprises a source region 50, a body region 51 and a gate region 52, the latter is formed in a vertical gate trench 53 and comprises a gate dielectric 54 and a gate electrode 55. By applying a voltage to the gate electrode 55, a channel formation in the body region 51 can be triggered. Below the body region 51, a drift region 56 is formed, which has the same conductivity type as the drain region 7 but a lower doping concentration. The source region 50, the drift region 56 and the drain region 7 are of a first conductivity type, the body region 51 is of a second conductivity type. In the example here, the first type is n-type, the second one is p-type.

The transistor cell 5 further comprises a field electrode region 11 formed in a field electrode trench 61. The field electrode region 11 comprises a field electrode 62 and a field dielectric 63 separating the latter from the drift region 56. The field electrode region 11 and the field electrode trench 61 have a spicular or columnar shape. The gate trench 53 with the gate region 52 circumscribing the transistor cell 5, see FIG. 6.

This schematic top view of FIG. 6 illustrates a plurality transistor cells 5, each having a needle-shaped field electrode region 11 in its center. The gate trench 53 with the gate region 52 forms a grid, see the solid lines in FIG. 6. In the active region 3, the transistor cells 5 are formed in the cells of the grid. Each transistor cell 5 comprises a needle-shaped field electrode region 11. As shown schematically in FIG. 6, the gate runner 12 extends U-shaped around the active region 3.

In the edge termination region 10, the field electrode regions 37 are formed, and their field electrodes 37.1 (see FIG. 1) are connected to source potential via the conductor lines 31. In the active region 3, the conductor pad structure 35 is formed in the metallization 4, e.g. as a plate covering the transistor cells 5 and being on source potential as a whole. In the edge termination region 10, the alternating conductor lines 31, 32 are required for the source and gate connections 38,39.

Figure 7:
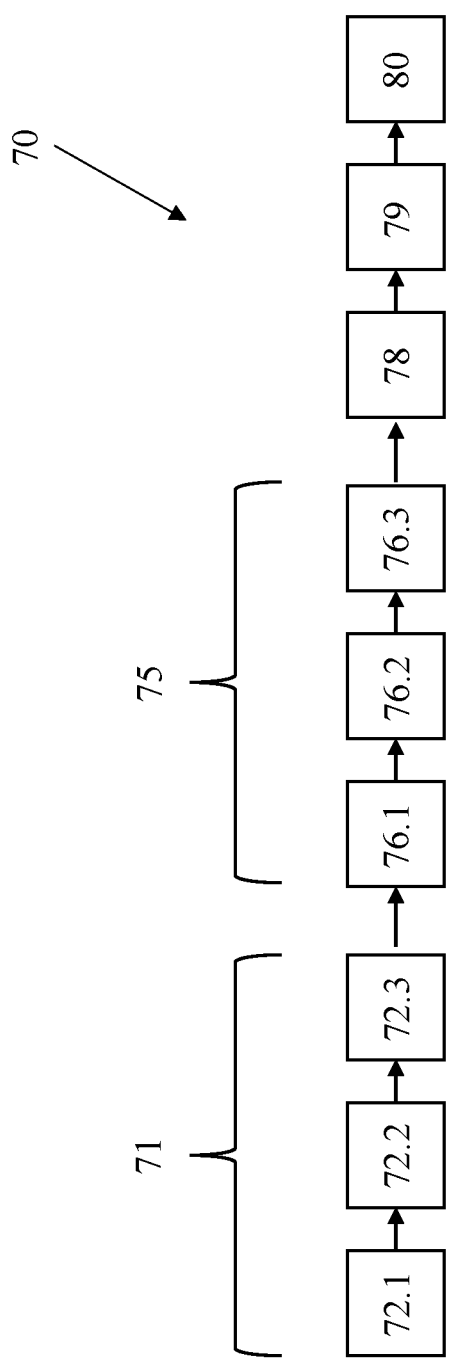
FIG. 7 shows a flow diagram illustrating the manufacturing of the die.

FIG. 7 illustrates the manufacturing of the metallization 4 and passivation 20 in a flow diagram 70. The metallization 4 is formed 71 by depositing 72.1 a titanium layer 4.1 and/or by depositing 72.2 a titanium nitride layer 4.2 and/or by depositing 72.3 a tungsten layer 4.3. After forming 71 the metallization 4, it can be structured, e.g. by applying a lithography step and a plasma etch, e.g. isotropic plasma etch. Thereafter, the passivation 20 is formed 75 on the metallization 4. In particular, a first silicon nitride layer 20.2 can be formed 76.1 on the metallization 4, and a silicon oxide layer 20.1 can be deposited 76.2 onto the first silicon nitride layer 20.2. The silicon oxide layer 20.1 can in particular be deposited 76.2 as a high-density plasma oxide. A deposition 76.3 of a second silicon nitride layer onto the silicon oxide layer is optional. Thereafter, the silicon oxide layer 20.1 can be structured 78 in a lithography step and used 79 as a hard mask for etching 80 the first silicon nitride layer 20.2.

Figure 8:
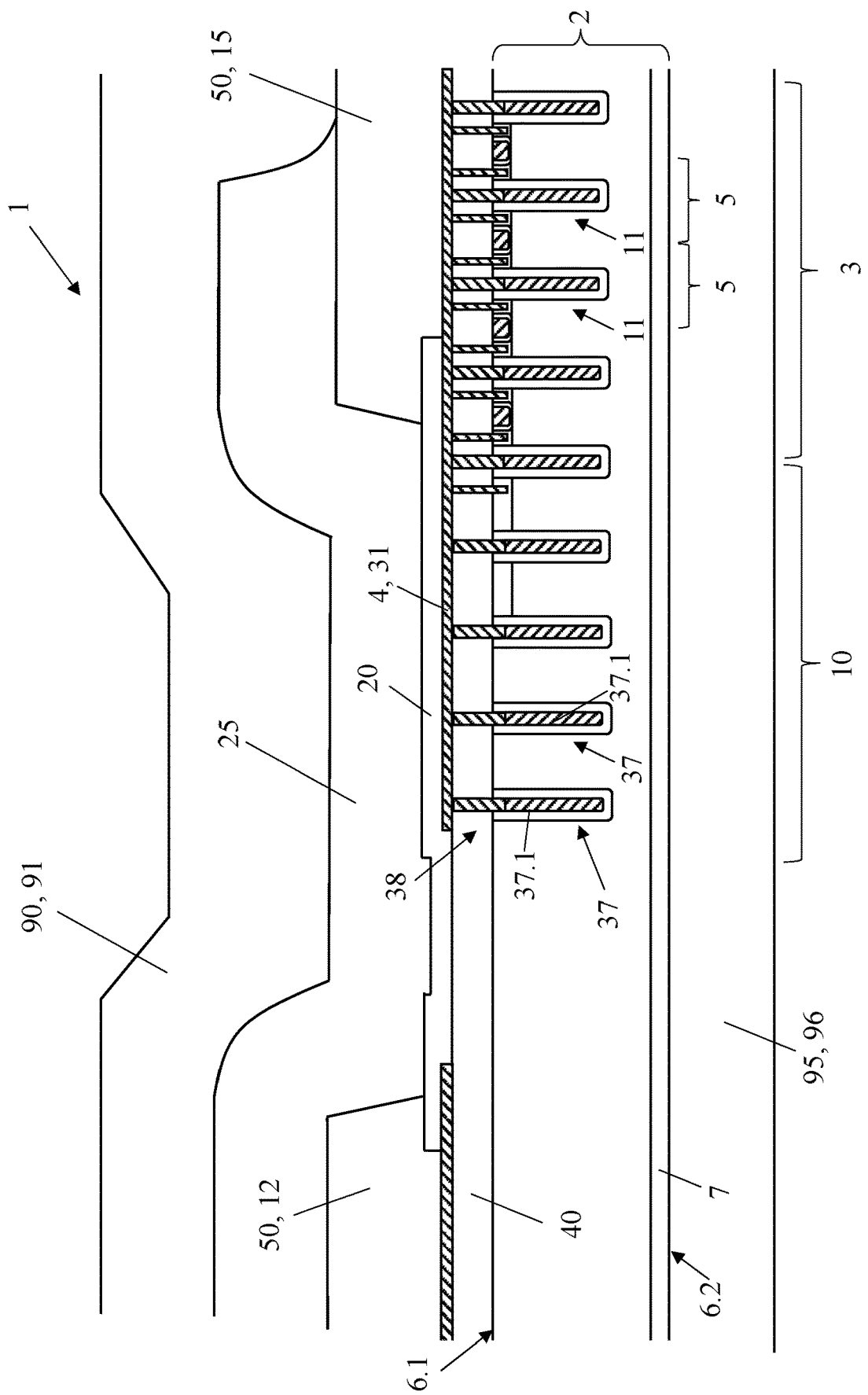
FIG. 8 illustrates a comparable view to FIG. 1, wherein additional layers are formed on a frontside and backside of the semiconductor die.

FIG. 8 shows a semiconductor die 1 in a vertical cross-section, comprising a semiconductor body 2 with an active region 3 and an edge termination region 10. For further details, reference is made to the description of FIG. 1 above, the same reference numerals indicate the same parts or parts with the same function. On the imide layer 25, an additional layer 90 is arranged, which is made of an epoxy resin 91 in the example shown. It can for instance have a thickness of at least 10 μm, possible upper limits being for example not more than 50 μm, 30 μm or 20 μm. One option for contacting the semiconductor die 1, in particular the source contact 15 and the gate runner 12 in a subsequent backend manufacturing is a bonding process, namely is to place bond wires on the frontside metal contact 50. Further, a conductive glue or in particular solder can be used to make an electrical contact between the metal contact 50 and the package, e. g. a clip or the lead frame itself (for instance source down mounting or in specific metal packages). In this respect, the additional layer 90 can for instance be used to form defined openings on the frontside for dispensing the solder which then connects the die 1 to the lead frame.

Figure 9:
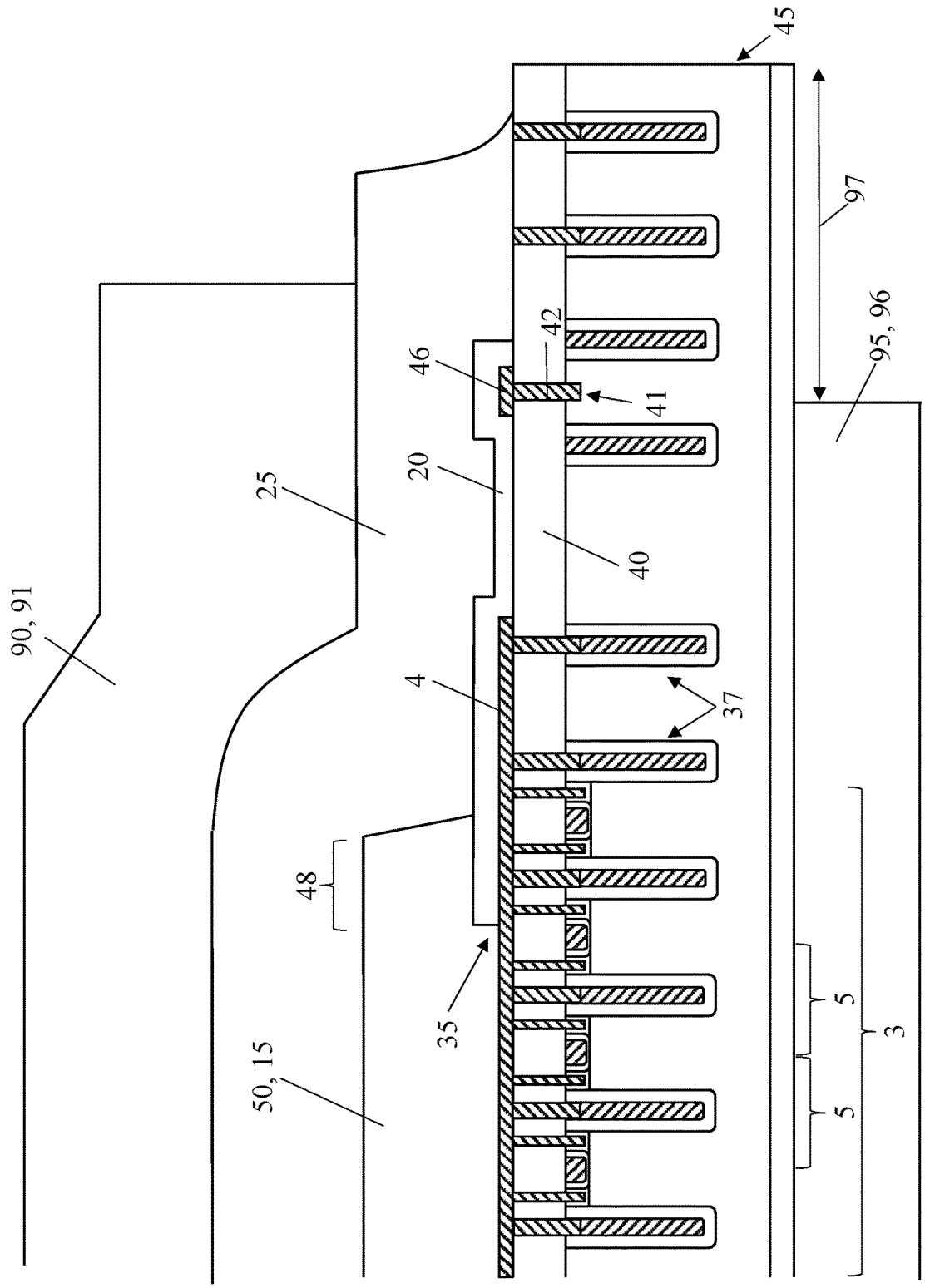
FIG. 9 shows a comparable view to FIG. 4, wherein additional layers are formed on a frontside and a backside of the semiconductor die.

A further layer 95 is formed on the backside of the die 1 and made of metal, in particular copper 96. The further layer 95 can for instance have a thickness of at least 1 µm and not more than 20 µm, 15 µm or 10 µm. In general, the further layer 95 can cover the whole backside, namely the drain region 7 completely. Alternatively, as shown in FIG. 9, the further layer 95 can cover the major part of the backside but leave a portion uncovered. The further layer 95 has for example a defined distance 97 from the edge 45 of the die 1, e.g., as shown in FIG. 9. The structured copper backside metallization can for instance improve the connection to the lead frame or to an attached clip.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor die, comprising:
   a semiconductor body comprising an active region;
   a Ti/TiN/W metallization disposed above and physically separated from the semiconductor body; and
   a silicon oxide passivation layer formed on the Ti/TiN/W metallization,
   wherein a first conductor line and a second conductor line are formed in the Ti/TiN/W metallization,
   wherein a frontside metal contact is formed above the active region,
   wherein the silicon oxide passivation layer is arranged vertically between the first conductor line and the second conductor line and the frontside metal contact,
   wherein the first conductor line and the second conductor line each have at least one of a lateral distance of 2 µm at maximum and a respective lateral width of 2 µm at maximum,
   wherein the Ti/TiN/W metallization has a total thickness of not more than 500 nm.

2. The semiconductor die of claim 1, further comprising an imide on top of the silicon oxide passivation layer.

3. The semiconductor die of claim 2, further comprising a silicon nitride layer interposed between the imide and the silicon oxide passivation layer.

4. The semiconductor die of claim 1, further comprising:
   a first SiN layer between the Ti/TiN/W metallization and the silicon oxide passivation layer; and
   a second SiN layer on the silicon oxide passivation layer.

5. The semiconductor die of claim 1, further comprising:
   a gate and/or a source contact above the active region,
   wherein the gate and/or the source contact has a thickness of at least 2 µm and is an uppermost metal layer of the semiconductor die,
   wherein a conductor line or pad structure of the Ti/TiN/W metallization extends at least partly below the gate and/or the source contact.

6. The semiconductor die of claim 5, wherein no further metal layer is arranged vertically in between the gate and/or the source contact and the Ti/TiN/W metallization.

* * * * *